United States Patent [19]

Takahashi

[11] Patent Number: 4,982,226

[45] Date of Patent: Jan. 1, 1991

[54] EXPOSURE DEVICE

[75] Inventor: Katsunori Takahashi, Nishigoshi, Japan

[73] Assignee: Mitsubishi Denki Kabushiki Kaisha, Japan

[21] Appl. No.: 246,733

[22] Filed: Sep. 20, 1988

[30] Foreign Application Priority Data

Jan. 22, 1988 [JP] Japan .................................. 63-12866

[51] Int. Cl.⁵ ............................................. G03B 27/42
[52] U.S. Cl. ........................................ 355/53; 355/68; 355/77
[58] Field of Search ...................... 355/68, 53, 43, 77, 355/69

[56] References Cited

U.S. PATENT DOCUMENTS 4,255,046 3/1981 Corona .................................. 355/68
4,712,910 12/1987 Sakato ............................... 355/68 X Primary Examiner—L. T. Hix
Assistant Examiner—D. Rutledge
Attorney, Agent, or Firm—Leydig, Voit & Mayer

[57] ABSTRACT

An exposure device includes a light source, means for transmitting radiation from the light source to the surface of a photosensitive film, and photosensitive information outputting means for measuring and outputting information which represents the state of exposure of the surface of the photosensitive film. A suitable exposure can be determined by detecting changes in the properties of the resist. In consequence, exposure can be adjusted to fit the exposed state of the photosensitive film which would be impossible in the prior art. Further, variations that occur in exposure can be decreased, and yield can be improved.

12 Claims, 2 Drawing Sheets

EXPOSURE DEVICE

BACKGROUND OF THE INVENTION

1. Field of the Invention:

The present invention relates to an exposure device which enables a suitable exposure to be obtained in a photolithography process for the manufacture of a semiconductor device.

2. Description of the Prior Art:

FIG. 1 schematically shows an example of a known exposure device.

In FIG. 1, the radiation from a light source 11 which may be a mercury lamp irradiates a reticle mask 12 which contains an image of patterns used in a photolithography process. The image on the reticle mask 12 is reduced by a reduction lens system 13, and is then projected onto resist 14 which serves as a photosensitive film, and which has coated the surface of a silicon wafer 15. The silicon wafer is placed on a wafer stage 16. The resist 14 has an exposed portion 17 which represents a portion exposed to the radiation from the light source 11 so as to form a latent image. A photo sensor 18 for measuring the illuminance of the radiation from the light source 11 is disposed between the light source 11 and the reticle mask 12.

The thus-arranged known exposure device is operated in the manner described below. The resist 14 is exposed by a step-and-repeat system or a projection analyzer. During exposure, part of the radiation from the light source 11, such as ultraviolet radiation, is received by the photo sensor 18 which measures the illuminance of the radiation from the light source 11. The brightness of light source 11 deteriorates as time elapses. The time during which a shutter (not shown) is opened is adjusted in accordance with the illuminance measured by photo sensor 18 so that a constant amount of light irradiates the exposed portion 17 from the light source 11.

In other words, exposure is determined by determining through experience the exposed state of the resist 14 which corresponds to the illuminance of the radiation from the light source 11.

In practice, exposure conditions differ in each exposure operation due to variations in the thickness of the resist 14 on the silicon wafer or the state of the resist 14, thereby generating variations in exposure. However, these factors are not taken into consideration when the exposure of the exposed portion 17 is determined.

Thus, the illuminance of radiation from the light source is suitably corrected. However, exposure of the exposed portion is not corrected on the basis of the various factors of the exposed portion, and accurate exposure of the exposed portion is therefore impossible.

SUMMARY OF THE INVENTION

The present invention is directed to eliminate the above-described problem of the prior art, and an object thereof is to provide an exposure device which is capable of directly controlling the exposure of an exposed portion of a resist so that the entire surface of a silicon wafer is stably exposed to diminish variations in the exposure and increase the production yield.

To achieve the above-described object, the present invention provides an exposure device which comprises a light source, a means for transmitting radiation from the light source to a predetermined portion on the surface of a photosensitive film, and a photosensitive information outputting means for detecting and outputting information from energy reflect from the surface of film disclosing the exposed state of the photosensitive film.

DETAILED DESCRIPTION OF THE PREFERRED EMBODIMENTS

Figure 1:
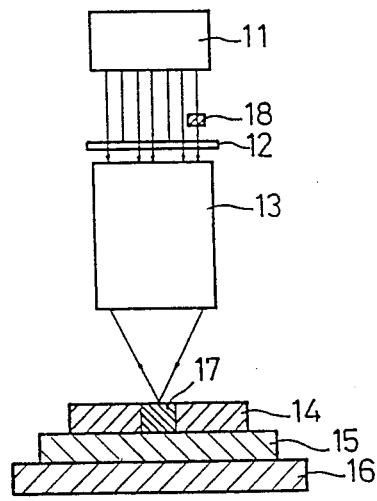
FIG. 1 is a schematic view of a known exposure device.
Figure 2:
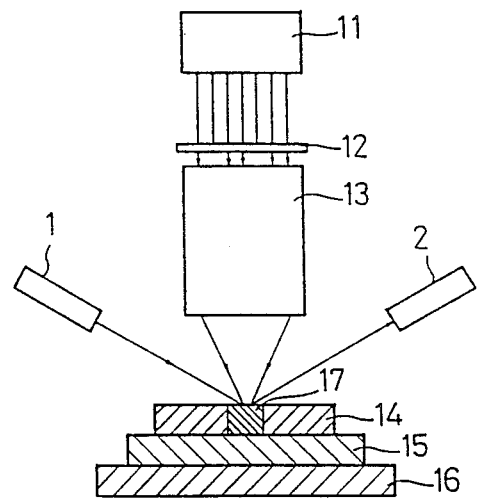
FIG. 2 is a schematic view of an exposure device, showing a first embodiment of the present invention.

A first embodiment of the present invention will be first described below with reference to FIG. 2. The radiation from the light source 11 irradiates the reticle mask 12 which contains an image of patterns projected in the photolithography process. The image on the reticle mask 12 is reduced by the reduction lens system 13, and is then projected onto a predetermined portion of the surface of the resist 14 which serves as a photosensitive film, i.e., the exposed portion 17.

The exposure device also includes a light-emitter 1 for emitting radiation having a predetermined wavelength toward the exposed portion 17, as well as a light receiver for detecting the light which is emitted from the light emitter 1 and which is then reflected by the exposed portion 17. Output information which represents the exposed state is based on variations in the reflected light measured by the light receiver 2. The light-emitter 1 and the light receiver 2 together form a photosensitive information output means.

Figure 3:
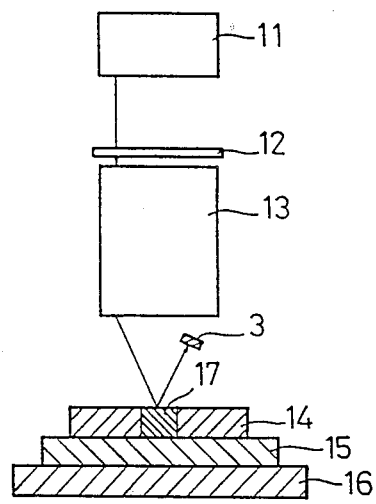
FIG. 3 is a schematic view of an exposure device, showing a second embodiment of the present invention.
Figure 4:
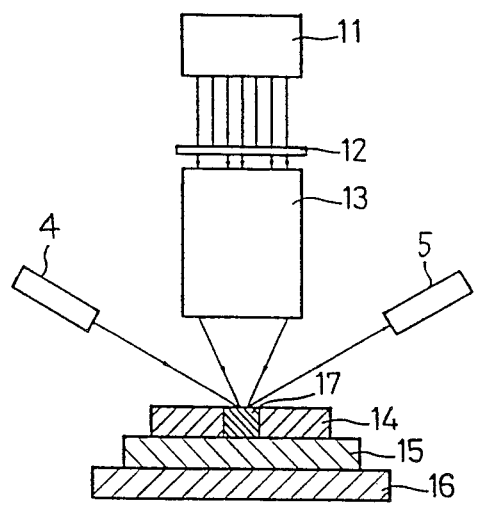
FIG. 4 is a schematic view of an exposure device, showing a third embodiment of the present invention.

Next, a second embodiment of the present invention will be described with reference to FIG. 3. The parts which are identical to those in FIG. 2 are designated by the same reference numerals. In this exposure device, the photosensitive information outputting means is constituted by a photosensor 3 for receiving the light which is emitted from the light source 11 and is reflected by the exposed portion 17 and for outputting information representing the exposed state using detected variations in the reflected light.

The thus-arranged first and second embodiments will be operated in the manner described below.

When the exposed portion 17 is exposed through the reticle mask 12 to ultraviolet light or other radiation, the properties of the exposed portion 17 change due to photochemical reaction caused by the absorbed light energy. Therefore, when light having a particular wavelength irradiates the exposed portion 17, the intensity or the wavelength of the reflected light changes after photochemical reaction has taken place. These changes stabilize after the photochemical reaction in the exposed portion of the photoresist film is completed. These changes in the intensity or the wavelength of the reflected light are detected by and output from the light receiver 2 shown in FIG. 2 or from the photosensor 3 shown in FIG. 3. The stabilization of the these changes enables an accurate determination of the completion of the exposure. Thus, the time during which the shutter (not shown) is opened, and an accurate exposure are determined from the reflected light.

A third embodiment of the present invention will be described below. The parts which are the same as those in FIG. 2 are denoted by the same reference numerals. In this exposure device, the photosensitive information outputting means is constituted by an ultrasonic wave generating device 4 for directing ultrasonic waves to the exposed portion 17, and an ultrasonic wave detecting device 5 for detecting the ultrasonic waves reflected by the exposed portion 17. As in the case of the aforementioned exposure devices, the ultrasonic wave detecting device 5 detects and outputs changes in the intensity or wavelength of the ultrasonic waves reflected by the exposed portion 17 that are caused by the photochemical reaction to enable an accurate determination of the completion of the exposure. The opening time of the shutter, hence the accurate exposure are thus determined from the reflected waves.

Thus, in this invention, a suitable exposure can be determined by detecting changes in the properties of the resist. In consequence, exposure can be adjusted to fit the state of the photosensitive film which would be impossible in the prior art. Further, variations that occur in exposure can be decreased, while production yield can be improved.

What is claimed is:

1. A device for controllably exposing a portion of a photosensitive film to light to produce a photochemical reaction in the exposed portion of the film, the film having light reflective characteristics that change during the reaction, comprising:
    a first light source for emitting light for producing a photochemical reaction in a portion of a photosensitive film that is exposed to the light from the first light source;
    means for controllably transmitting the light from the first light source to impinge upon, expose, and cause a photochemical reaction in a selected portion of the film; and
    control means comprising a second light source for emitting light having a controlled characteristic for impinging upon and being reflected from the selected portion of the film and photosensor means for receiving light from said second light source and reflected from the film, for sensing changes in the controlled characteristic of the reflected light, and for actuating said means for controllably transmitting to terminate exposure of the film to the light from the first light source when the controlled characteristic of the reflected light from the second light source stablizes.

2. The device according to claim 1 wherein the controlled characteristic is wavelength and the photosensor means is responsive to changes in wavelength.

3. The device according to claim 1 wherein the controlled characteristic is intensity and the photosensor means is responsive to changes in intensity.

4. The device according to claim 1 wherein said light transmitting means includes a mask and a lens system disposed on a side of said mask opposite said first light source, said lens system condensing and focusing the light from the first light source which has passed through said mask.

5. A device for controllably exposing a portion of a photosensitive film to light to produce a photochemical reaction in the exposed portion of the film, the film having ultrasonic wave characteristics that change during the reaction, comprising:
    a light source for emitting light for producing a photochemical reaction in a portion of a photosensitive film that is exposed to the light;
    means for controllably transmitting the light from the light source to impinge upon, expose, and cause a photochemical reaction in a selected portion of the film; and
    control means comprising ultrasonic wave source means for emitting ultrasonic waves having a controlled characteristic for impinging upon and being reflected from the selected portion of the film exposed to the light and ultrasonic wave detecting means for receiving ultrasonic waves reflected from the film, for sensing changes in the controlled characteristic of the reflected ultrasonic waves, and for actuating said means for controllably transmitting to terminate exposure of the film to the light when the controlled characteristic of the reflected ultrasonic waves stabilizes.

6. The device according to claim 5 wherein said light transmitting means includes a mask and a lens system disposed on a side of said mask opposite said light source, said lens system condensing and focusing the light from said light source which has passed through said mask.

7. The device according to claim 5 wherein the controlled characteristic is wavelength and the ultrasonic wave detecting means is responsive to changes in wavelength.

8. The device according to claim 5 wherein the controlled characteristic is intensity and the ultrasonic wave detecting means is responsive to changes in intensity.

9. A device for controllably exposing a portion of a photosensitive film to light to produce a photochemical reaction in the exposed portion of the film, the film having light reflective characteristics that change during the reaction, comprising:
    a light source for emitting light having a controlled characteristic and for producing a photochemical reaction in a portion of a photosensitive film that is exposed to the light;
    means for controllably transmitting the light to impinge upon, expose, and cause a photochemical reaction in a selected portion of the film; and
    control means comprising photosensor means disposed between said means for transmitting and the film for receiving light reflected from the film, for sensing changes in the controlled characteristic of the reflected light, and for actuating said means for controllably transmitting to terminate exposure of the film to the light when the controlled characteristic of the reflected light stabilizes.

10. The device according to claim 9 wherein said light transmitting means includes a mask and a lens system disposed on a side of said mask opposite said light source, said lens system condensing and focusing the light from said light source which has passed through said mask.

11. The device according to claim 9 wherein the controlled characteristic is wavelength and the photosensor means is responsive to changes in wavelength.

12. The device according to claim 9 wherein the controlled characteristic is intensity and the photosensor means is responsive to changes in intensity.

* * * * *